United States Patent
Jimarez et al.

(10) Patent No.: US 6,497,943 B1
(45) Date of Patent: Dec. 24, 2002

(54) SURFACE METAL BALANCING TO REDUCE CHIP CARRIER FLEXING

(75) Inventors: Lisa J. Jimarez, Newark Valley, NY (US); Miguel A. Jimarez, Newark Valley, NY (US); Mark V. Pierson, Binghamton, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/503,395

(22) Filed: Feb. 14, 2000

(51) Int. Cl.$^7$ .............................. B32B 3/00; H01L 23/48
(52) U.S. Cl. ....................... 428/209; 174/255; 174/260; 257/778; 257/779; 257/780
(58) Field of Search .......................... 428/209; 174/250, 174/255, 260; 257/778, 779, 780, 786

(56) References Cited

U.S. PATENT DOCUMENTS

| | | | |
|---|---|---|---|
| 5,120,573 A | * 6/1992 | Miyazaki et al. | ............. 427/96 |
| 5,886,877 A | * 3/1999 | Shingai et al. | .............. 361/768 |
| 5,888,631 A | 3/1999 | Sylvester | |
| 5,900,312 A | 5/1999 | Sylvester | |
| 6,204,453 B1 | * 3/2001 | Fallon et al. | ................ 174/255 |
| 6,204,456 B1 | * 3/2001 | Lauffer et al. | .............. 174/262 |
| 6,329,713 B1 | * 12/2001 | Farquhar et al. | ............ 257/712 |
| 6,359,235 B1 | * 3/2002 | Hayashi | ...................... 174/260 |

OTHER PUBLICATIONS

"High Performance Carrier Technology: Materials And Fabrication", by Light et al, 1993 International Electronics Packaging Conference, San Diego, California, vol. one. No Month.

"High Performance Carrier Technology", by Heck et al, 1993 International Electronics Packaging Conference, San Diego, California, vol. one. No Month.

"Process Considerations in the Fabrication of Teflon Printed Circuit Boards", by Light et al, 1994 Proceedings, 44 Electronic Components & Technology Conference, 5/1994.

* cited by examiner

*Primary Examiner*—Cathy Lam
(74) *Attorney, Agent, or Firm*—Schmeiser, Olsen & Watts; Lawrence R. Fraley

(57) ABSTRACT

A surface metal balancing structure for a chip carrier, and an associated method of fabrication, to reduce or eliminate thermally induced chip carrier flexing. A substrate, such as a chip carrier made of organic dielectric material, is formed and includes: internal circuitization layers, a plated through hole, and outer layers comprised of an allylated polyphenylene ether. A stiffener ring for mechanically stabilizing the substrate is bonded to an outer portion, such as an outer perimeter portion, of the top surface of the substrate, in light of the soft and conformal organic material of the substrate. The top and bottom surfaces of the substrate have metal structures, such as copper pads and copper circuitization, wherein a surface area (A) multiplied by a coefficient of thermal expansion (C) is greater for the metal structure at the bottom surface than for the metal structure at the top surface. A metal pattern is adjacent to the top surface so as to make the product AC of metal structures at or near the top and bottom surfaces approximately equal. The metal pattern reduces or eliminates flexing of the substrate in an elevated temperature environment, such as during a reflow of solder that couples a semiconductor chip to the substrate.

17 Claims, 8 Drawing Sheets

SURFACE METAL BALANCING TO REDUCE CHIP CARRIER FLEXING

BACKGROUND OF THE INVENTION

1. Technical Field

The present invention relates to a surface metal balancing structure for a chip carrier, and an associated method of fabrication, to reduce or eliminate thermally induced chip carrier flexing.

2. Related Art

A semiconductor chip may be mechanically and conductively coupled to a chip carrier by having conductive contacts on the chip (e.g., Controlled Collapse Chip Connection solder balls) solderably coupled to the top surface of the chip carrier. During processing steps that elevate the temperature of the chip carrier, such as during a reflow step for solderably joining the chip to the chip carrier, a spatial distribution of coefficient of thermal expansion (CTE) due to material inhomogeneities within the chip carrier may cause the chip carrier to bow (or flex) upward or downward and thus deviate from planarity. For example, there may be large copper pads on the bottom of the chip carrier to accommodate a ball grid array of solder balls for coupling the chip carrier to a circuit card, and smaller amounts of copper, such as in the form of copper circuitization and/or copper pads for joining a chip to the chip carrier on the top surface of the chip carrier. The spatial distribution of CTE, and consequent bowing or sagging of the chip carrier when the chip carrier is heated, is a result of copper imbalance between the top and bottom surfaces of the chip carrier combined with volumetric distribution within the chip carrier of materials having different magnitudes of CTE.

The preceding chip carrier flexing problem increases in severity if the chip carrier is made of compliant material, such as compliant organic material which cannot be easily handled (e.g., a material having a modulus of less than 300,000 psi). An organic chip carrier that is highly compliant may benefit from a rigid "stiffener ring" bonded to an outer perimeter of the top surface of the chip carrier in order to enhance the structural characteristics of the chip carrier. That is, the stiffener ring makes the chip carrier more mechanically stable and thus easier to handle. Unfortunately, the stiffener ring acts as a mechanical clamp on the outer perimeter of the chip carrier that constrains outer portions of the chip carrier from expanding, particularly when subjected to elevated temperature. In contrast, center portions of chip carrier at which chips are typically attached, are not constrained by the stiffener ring. Thus, expansion of the central portions, when heated, accentuates the chip carrier bowing by causing a distinct upward bulge in the central portion of the chip carrier top surface.

An adverse consequence of chip carrier bowing, particularly when a stiffener ring is used with a compliant organic chip carrier, is unreliable coupling of a chip to the chip carrier, as illustrated in FIGS. 1 and 2. FIG. 1 shows a semiconductor chip 10 resting on an organic chip carrier 20 at ambient room temperature, wherein a top surface 14 of the chip carrier 20 is flat, and wherein solder balls 11, 12, and 13 on the semiconductor chip 10 are in conductive contact with solder bumps 24, 25, and 26 at the conductive pads 17, 18, and 19 on the top surface 14 of the chip carrier 20, respectively. A stiffener ring 15 is bonded to the outer perimeter of the chip carrier 20 by an interfacing adhesive 16. FIG. 2 shows the chip carrier 20 of FIG. 1 under temperature elevation, such as when solder from the solder bumps 24, 25, and 26 is reflowed around the solder balls 11, 12, and 13 in an attempt to conductively join the solder balls 11, 12, and 13 to the conductive pads 17, 18, and 19, respectively. At the elevated temperature, the center the chip carrier 20 is bows (or bulges) upward in the direction 22, such that the solder balls 11 and 13 are no longer in conductive contact with the conductive pads 17 and 19, respectively. Thus, the chip carrier flexing impairs the ability to reliably join a chip to a chip carrier. The bowing B may exceed 2 to 3 mils during solder reflow.

A method is needed for reducing or eliminating flexing of a compliant organic chip carrier in an elevated temperature environment, and particularly when solder is reflowed around solder balls of a semiconductor chip for joining the semiconductor chip to the chip carrier.

SUMMARY OF THE INVENTION

The present invention provides an electronic structure, comprising:
a substrate including an organic dielectric material and having an internal conductive structure within and through the substrate;
a stiffener ring adhesively coupled to an outer portion of a first surface of the substrate;
a first metal structure, coupled to the first surface of the substrate, and having a surface area $A_1$, and a coefficient of thermal expansion $C_1$;
a second metal structure, coupled to a second surface of the substrate, and having a surface area $A_2$ and a coefficient of thermal expansion $C_2$, wherein $C_2A_2$ exceeds $C_1A_1$, and wherein the internal conductive structure conductively couples the first metal structure to the second metal structure; and
a metal pattern, adjacent to the first surface of the substrate, and having a surface area $A_3$ and a coefficient of thermal expansion $C_3$, wherein $(C_2A_2-C_1A_1-C_3A_3)$ is less than $(C_2A_2-C_1A_1)$ in magnitude, and wherein the metal pattern is electrically insulated from any other conductive structure on or within the substrate.

The present invention provides a method for forming an electronic structure, comprising the steps of:
forming a substrate that includes an organic dielectric material and further includes an internal conductive structure within and through the substrate;
adhesively coupling a stiffener ring to an outer portion of a first surface of the substrate;
forming a first metal structure coupled to the first surface of the substrate, wherein the first metal structure has a surface area $A_1$ and a coefficient of thermal expansion $C_1$;
forming a second metal structure coupled to a second surface of the substrate, wherein the second metal structure has a surface area $A_2$ and a coefficient of thermal expansion $C_2$, wherein $C_2A_2$ exceeds $C_1A_1$, and wherein the internal conductive structure conductively couples the first metal structure to the second metal structure; and
forming a metal pattern adjacent to the first surface of the substrate, wherein the metal pattern has a surface area $A_3$ and a coefficient of thermal expansion $C_3$, wherein $(C_2A_2-C_1A_1-C_3A_3)$ is less than $(C_2A_2-C_1A_1)$ in magnitude, and wherein the metal pattern is electrically insulated from any other conductive structure on or within the substrate.

The present invention has the advantage of reducing or eliminating flexing of an organic chip carrier in an elevated temperature environment, particularly when solder is reflowed around solder balls of a semiconductor chip for joining the semiconductor chip to the chip carrier.

The present invention has the advantage of being implementable at little or no extra cost, inasmuch as the metal pattern may be formed concurrently with, and as part of the process of, circuitizing the chip carrier.

The present invention has the advantage of improving the structural stability of a highly compliant organic chip carrier by providing by adding mechanical rigidity where insulatively isolated metal is added to the chip carrier.

The present invention has the advantage of having bounding layers on a chip carrier wherein the coefficient of thermal expansion of the bounding layers increase than no more than a factor of about 3 as the temperature increases from just below to just above the glass transition temperature of the bounding layers.

DETAILED DESCRIPTION OF THE INVENTION

Figure 3:
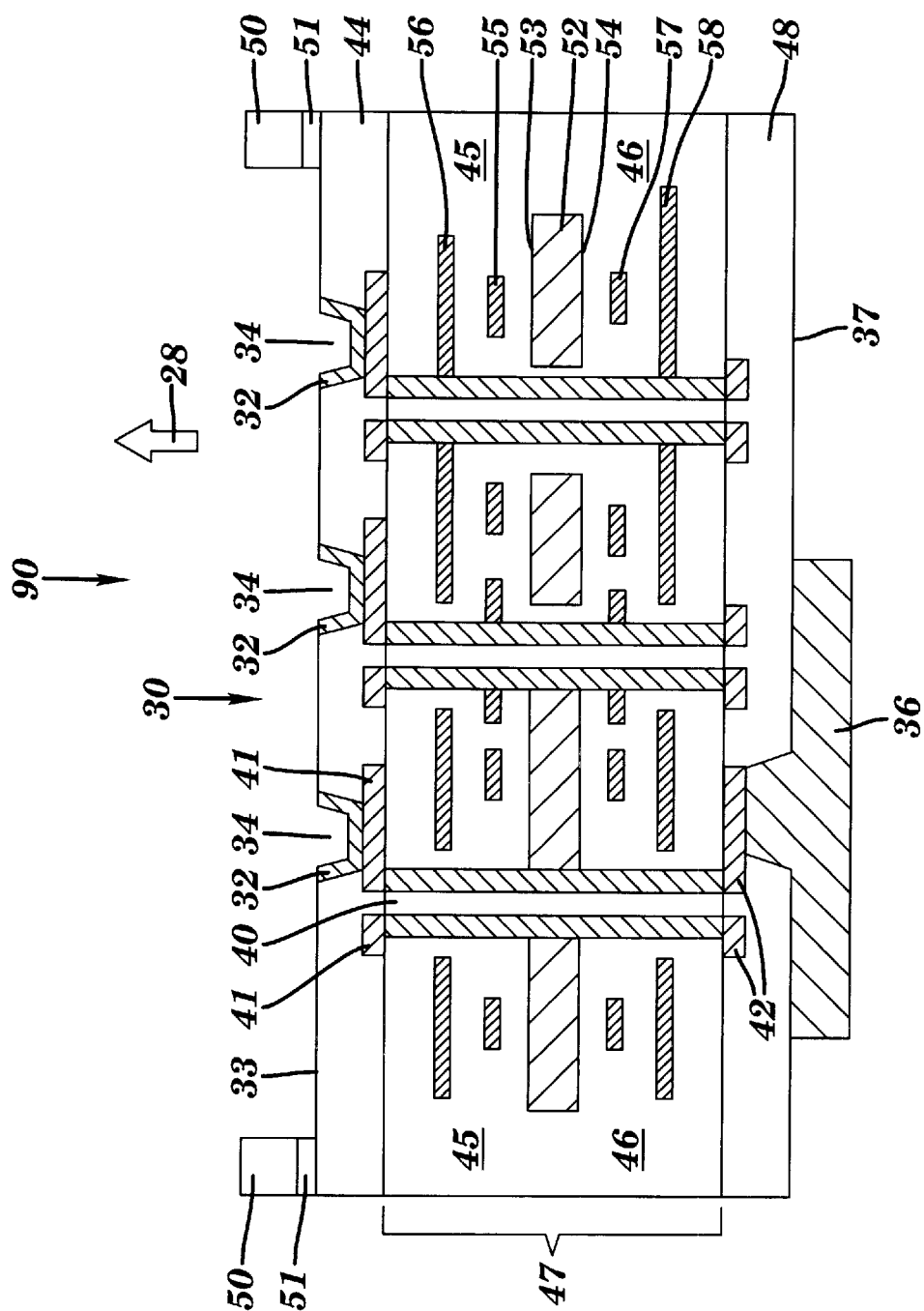
FIG. 3 depicts a front cross-sectional view of an organic substrate having first and second metal structures on top and bottom surfaces, respectively, of the organic substrate, in accordance with a preferred embodiment of the present invention.

FIG. 3 illustrates a front cross-sectional view of an electronic structure 90 comprising an organic substrate 30 that includes an organic material, a metal structure 32 on a top surface 33 of the organic substrate 30, and a metal structure 36 on a bottom surface 37 of the organic substrate 30, in accordance with a preferred embodiment of the present invention. The metal structure 32 may include a metal plating (e.g., such as a copper plating) on at least one plated blind via 34, and any conductive circuitization (not shown) on the top surface 33. The plating on the plated blind via 34 is intended to be conductively coupled to an electronic device, such as the semiconductor chip 76 shown infra in FIG. 12. The metal structure 36 may include metal pads, such as ball grid array (BGA) pads (see, e.g., FIG. 4 for an illustration of BGA pads), and any conductive circuitization (not shown) on the bottom surface 37. BGA pads are intended to be conductively coupled to an electronic assembly such as a circuit card. The metal structure 32 and the metal structure 36 may be conductively coupled by any internal conductive structure within the organic substrate 30, such as a plated though hole (PTH) 40, together with a metal pad 41 conductively interfacing the metal structure 32 with the PTH 40, and a metal pad 42 conductively interfacing the metal structure 36 with the PTH 40. Many other internal conductive structures are possible. For example, the metal structure 32 could each be conductively coupled to a first plated blind extending into an interior level of the organic substrate 30, the metal structure 36 could be conductively coupled to into a second plated blind extending into the interior level, such that the first and second blind vias are coupled by interfacing conductive circuitization at the interior level.

FIG. 3 shows the organic substrate 30 as comprising four dielectric layers: dielectric layer 44 denoted as a top layer that is included within the top surface 33, dielectric layer 48 denoted as a bottom layer that is included within the bottom surface 37, and dielectric layers 45 and 46 within a region 47, wherein the region 47 interfaces with dielectric layers 44 and 48. The region 47 (which comprises dielectric layers 45 and 46 as stated supra) includes the organic dielectric material. Additionally, the region 47 includes a thermally conductive layer 52 with the dielectric layers 45 and 46 on opposing surfaces 53 and 54, respectively, of the thermally conductive layer 52. The dielectric layer 45 includes a signal plane 55 and a power plane 56, wherein the signal plane 55 is positioned between the thermally conductive layer 52 and the power plane 56. A power plane comprises a continuous sheet of conductive material (e.g., copper) having at least one through hole. A signal plane comprises a layer of shielded signal conductors. The dielectric layer 46 includes a signal plane 57 and a power plane 58, wherein the signal plane 57 is positioned between the thermally conductive layer 52 and the power plane 58.

The dielectric layers 44 and 48 each have a thickness preferably between about 40 microns and about 60 microns. The dielectric layers 44 and 48 provide a structural stability to the substrate 30, inasmuch as the organic material in the dielectric layers 45 and 46 is soft compliant and thus may be difficult to handle in an absence of the more rigid dielectric layers 44 and 48. Additionally, the dielectric layers 44 and 48 each preferably include a dielectric material having a CTE that by no more than a factor of about 3 as the temperature increases from just below to just above the glass transition temperature ($T_g$) of the dielectric material of the dielectric layers 44 and 48. In contrast, other materials that could be used in the dielectric layers 44 and 48 generally have a CTE that increases by an order of magnitude or more as the temperature in increased through a $T_g$ transition. A preferred dielectric material for the dielectric layers 44 and 48 includes a resin having an allylated polyphenylene ether (APPE) having $T_g$ of about 210° C. and characterized by a CTE increase of a factor of about 2.5 as the temperature increases from just below to just above $T_g$. A particularly useful APPE for the dielectric layers 44 and 48 is an APPE resin coated on a copper foil, made by the Asahi Chemical Company of Japan and identified as Asahi product number PC5103.

Notwithstanding the dielectric layers 44 and 48, the substrate 30 remains somewhat compliant, and its structural stability may be further enhanced with a stiffener ring 50 bonded to an outer portion, such as an outer perimeter portion as shown in FIG. 3, of the top surface 33 of the organic substrate 30 by use of an interfacing adhesive 51. In order to avoid or minimize differential thermal expansion between the stiffener ring 50 and the organic substrate 30, the CTE of the stiffener ring 50 should preferably not differ by more than about 10% from the spatially average CTE of a composite structure of: the organic substrate 30, the dielectric layer 44, and the dielectric layer 48. The thermally conductive layer 52 preferably has a coefficient of thermal expansion (CTE) between about 4 ppm/° C. and about 8 ppm/° C., such that a spatially averaged CTE of said composite structure is between about 10 ppm/° C. and about 12 ppm/° C. If the organic substrate 30 has a spatially averaged CTE between about 10 ppm/° C. and about 12 ppm/° C., a suitable material for the stiffener ring 50 is, inter alia, 430 series stainless steel having a CTE of 10.0 ppm/° C.

The dielectric layers 45 and 46 may be laminated to the thermally conductive layer 52 by, inter alia, placing the layers 45 and 46 on the opposing surfaces 53 and 54 of the thermally conductive layer 52, to form a sandwich with the thermally conductive layer 52 as a middle layer of the sandwich. A pressure is applied to the sandwich, such as by using a lamination press. The pressure is between about 1000 psi and about 2000 psi at a temperature between about 305° C. and about 400° C. The PTH 40, which passes through the region 47, may be formed by, inter alia, laser or mechanical drilling to form a via. A thin (e.g., 1 to 3 microns) metal (e.g., copper) is electrolessly plated on the via wall, using a seeding material such as palladium to promote electroless adhesion of the metal to the via wall. Then a thicker (e.g., 1 mil) layer of the metal (e.g., copper) is electroplated over the electroless coat of the metal. Note that other metal plating techniques, known to one of ordinary skill in the art, may be used.

The dielectric layers 44 and 48 may be laminated on the dielectric layers 45 and 46, respectively, by any method known to one of ordinary skill in the art, in accordance with the particular dielectric material used in the dielectric layers 44 and 48. For example, the dielectric layers 44 and 48, if including the allylated polyphenylene ether (APPE) coated on a copper foil such as the Asahi resin PC5103, may be formed on the dielectric layers 45 and 46, respectively, by pressurization in a range of about 1000 psi to about 2000 psi at an elevated temperature between about 180° C. and about 210° C. for a time of at least about 90 minutes. The pressurization and elevated temperatures causes the APPE resin to flow and become cured, resulting in lamination of the the dielectric layers 44 and 48 to the dielectric layers 45 and 46, respectively. After the pressurization, the copper foils are removed in any manner known to one of ordinary skill in the art, such as by etching.

The plated blind via 34 may be formed by any method known to one of ordinary skill in the art, such as by laser drilling into the dielectric layer 44 down to the metal pad 41 to form a via, followed by electroless plating of metal (e.g., copper) on seeded surfaces (e.g., palladium seeded surfaces) of the via to form an electroless layer of the metal. After the electroless plating, the metal (e.g., copper) is electroplated over the electroless layer to form the plated blind via 34.

For definitional purposes, let $C_1$ and $A_1$ denote the CTE and surface area of the metal structure 32, respectively. Let $C_2$ and $A_2$ denote the CTE and surface area of the metal structure 36, respectively. The values of $C_1$, $A_1$, $C_2$, and $A_2$ are at ambient room temperature. It is assumed that $C_2A_2$ exceeds $C_1A_1$. Under the preceding assumption and upon a heating of the substrate 30, the top surface 33 will bow (or bulge) upward in a direction 28, due to a thermal expansion imbalance between metalizations of the metal structure 32 and the metal structure 36 in consideration of the stiffener ring 50, as explained supra in the "Related Arts" section.

The organic structure 30 in FIG. 3 is illustrative and many other alternative structures are within the scope of the present invention. For example, the structure 30 may have any number of dielectric layers, including as few as one dielectric layer. As another example, any of the thermally conductive layer 52, the signal planes 55 and 57, and the power planes 56 and 58 may or may not be present. It should be further noted that words such as "top," "bottom," "up," and "down," do not imply a directional orientation with respect to a radial direction from a center of the Earth, but rather serve to orient the reader in viewing the Figures in this patent application.

Figure 4:
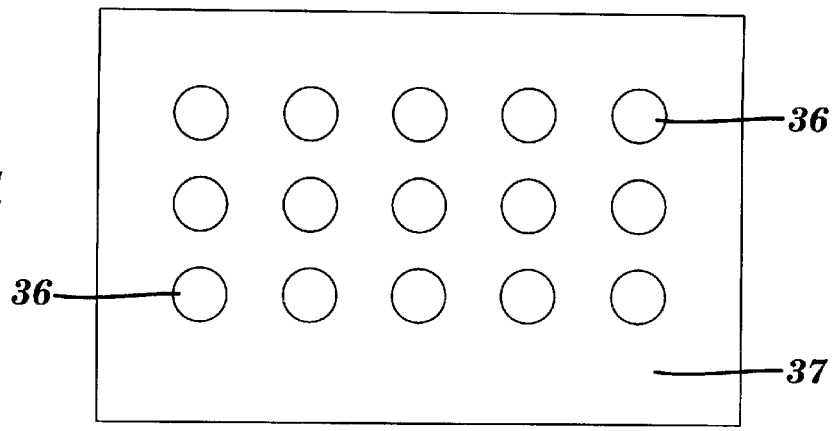
FIG. 4 depicts a bottom view of the organic substrate of FIG. 3, showing BGA pads illustrating the second metal structure on a bottom surface of the substrate.

FIG. 4 shows a bottom view of the organic substrate 30 of FIG. 3, showing BGA pads illustrating the second metal structure 36 on the bottom surface 37 of the organic substrate 30. Each of the 15 BGA pads of the second metal structure 36 in FIG. 4 is intended to contact a BGA solder ball for coupling the organic substrate 30 to a circuit card. Note that the BGA pad pattern in FIG. 4 is an example of the second metal structure 36. Any geometric configuration of metal on the bottom surface 37 of the organic substrate 30 may represent the second metal structure 36.

Figure 5:
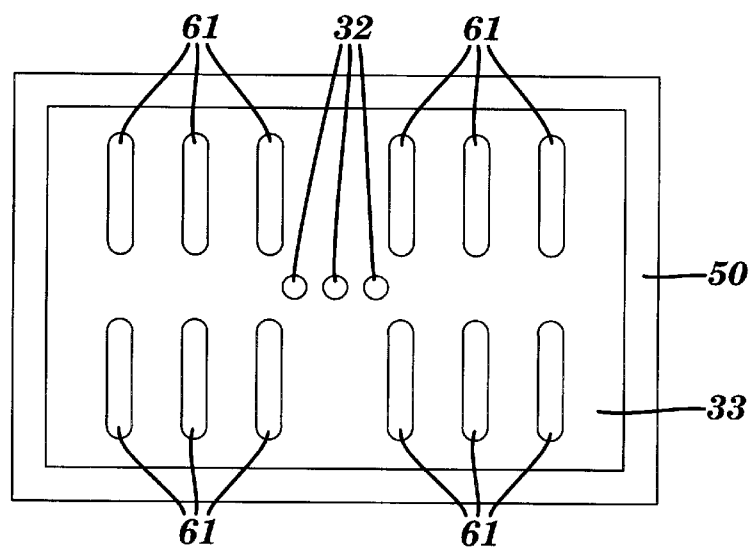
FIG. 5 depicts a top view of the organic substrate of FIG. 3, showing the first metal structure with a first metal pattern coupled to a top surface of the substrate.

FIG. 5 illustrates a top view of the organic substrate 30 of FIG. 3, along with the stiffener ring 50, showing a metal pattern 61 coupled to unoccupied space at or adjacent to (see discussion following description of FIGS. 9–11 for a definition of "adjacent to") the top surface 33, in order to compensate for an imbalance between $C_1A_1$ (of the top surface 33) and $C_2A_2$ (of the bottom surface 37). In particular, the metal pattern 61 has a CTE and surface area of $C_3$ and $A_3$, respectively, such that $(C_2A_2-C_1A_1-C_3A_3)$ is less than $(C_2A_2-C_1A_1)$ in magnitude. The value of $C_3$ and $A_3$ are at ambient room temperature. Thus, the metal pattern 61 compensates partially or fully for a thermal imbalance between $C_1A_1$ and $C_2A_2$. $C_2A_2$ and $(C_3A_3+C_1A_1)$ should differ in magnitude by no more than about 20%, and preferably by no more than about 10%. Note that if $C_1$, $C_2$, and $C_3$ are about equal, then the preceding condition takes the form of having $A_2$ and $(A_3+A_1)$ differ in magnitude by no more than about 20%, and preferably by no more than about 10%. If the first metal structure 32, the second metal structure 36, and the metal pattern 61 are each comprised of the same metal, then $C_1$, $C_2$, and $C_3$ are about equal. Nonetheless, the first metal structure 32, the second metal structure 36, and the metal pattern 61 may include different metals, and $C_1$, $C_2$, and $C_3$ may accordingly differ. Copper, which has a CTE of about 17 ppm/° C., is a preferred metal for the metal pattern 61. Other metal suitable for the metal pattern 61 include nickel, which has a CTE of about 17 or 18 ppm/° C., and aluminum, which has a CTE of about 20 ppm/° C.

The thicknesses of the first metal structure 32, the second metal structure 36, and the metal pattern 61 are preferably comparable, and deviations in thickness within about 10% will not significantly impact the effectiveness of the thermal balancing scheme described supra. If said thickness deviations exceed about 10%, then the surface exposed $A_3$ of the metal pattern 61 may be adjusted to deviate from the preceding formula of balancing $(A_3C_3+A_1C_1)$ against $A_2C_2$, to whatever extent is necessary for achieving a desired level of thermal balancing. Said adjusting of $A_3$ may be accomplished by testing, and without undue experimentation, by recognizing that a smaller thickness in the metal pattern 61 allows more thermal expansion length of the metal pattern 61 parallel to the top surface 33 of the organic substrate 30 than does a larger thickness, for a given surface area $A_3$. Thus, a thickness in the metal pattern 61 that is too large, which inhibits expansion parallel to the top surface 33, may be compensated for by increasing the surface area $A_3$.

The metal pattern 61 may be coupled to any unoccupied space at the top surface 33. The metal pattern 61 is insulatively isolated from any other conductive structure on or within the substrate 30. Thus, the metal pattern 61 has no electrical function, and serves the particularized function of balancing thermal expansion of metalization on the top and bottom surfaces 33 and 37, respectively, so as to reduce or eliminate flexing of the substrate 30 when subjected to an elevated temperature.

The effectiveness of the metal pattern 61 for thermal balancing purposes is insensitive to a spatial distribution of the metal pattern 61 on the top surface 33, provided that a combined spatial distribution of the metal pattern 61 and the metal structure 32 on the top surface 33 is not highly skewed in comparison with a spatial distribution of the metal structure 36 on the bottom surface 37.

Figure 6:
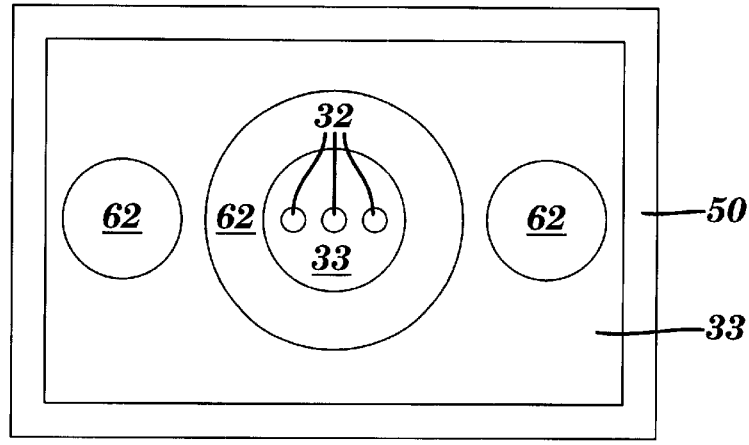
FIG. 6 depicts a top view of the organic substrate of FIG. 3, showing the first metal structure with a second metal pattern coupled to a top surface of the substrate.
Figure 7:
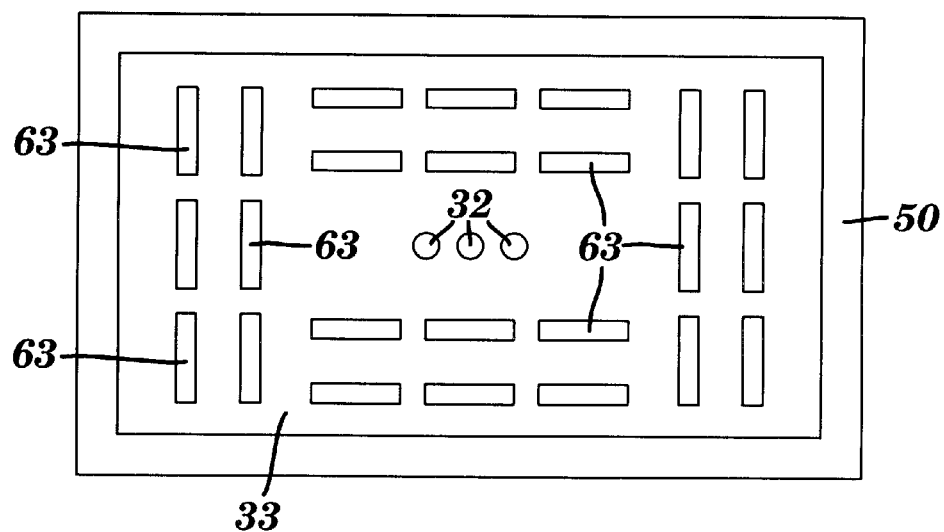
FIG. 7 depicts a top view of the organic substrate of FIG. 3, showing the first metal structure with a third metal pattern coupled to a top surface of the substrate.
Figure 8:
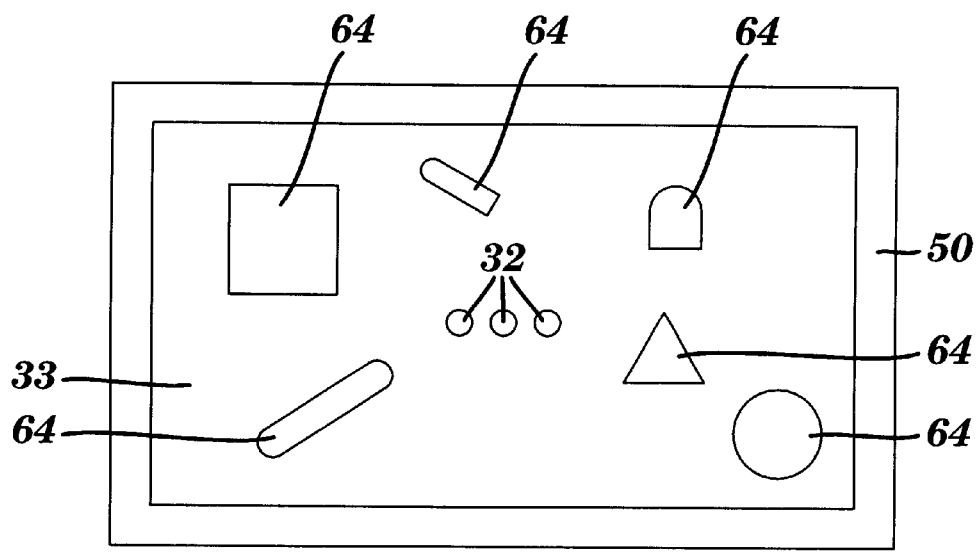
FIG. 8 depicts a top view of the organic substrate of FIG. 3, showing the first metal structure with a fourth metal pattern coupled to a top surface of the substrate.

The geometry of the metal pattern 61 is arbitrary, and metal of any geometry may be coupled to the top surface 33 to effectuate thermal balancing, provided that such metal is insulatively isolated from any other conductive structure on or within the substrate 30. Other examples of metal patterns that may be coupled to unoccupied space at or adjacent to (see discussion following description of FIGS. 9–11 for a definition of "adjacent to") the top surface 33 are shown in FIGS. 6, 7, and 8, namely metal patterns 62, 63, and 64, respectively. FIG. 6 shows the metal pattern 62 having a circular geometric arrangement. FIG. 7 shows the metal pattern 63 having a two-dimensional rectangular geometric arrangement. FIG. 8 shows the metal pattern 64 having a random geometric arrangement as to both shape and location.

Figure 9:
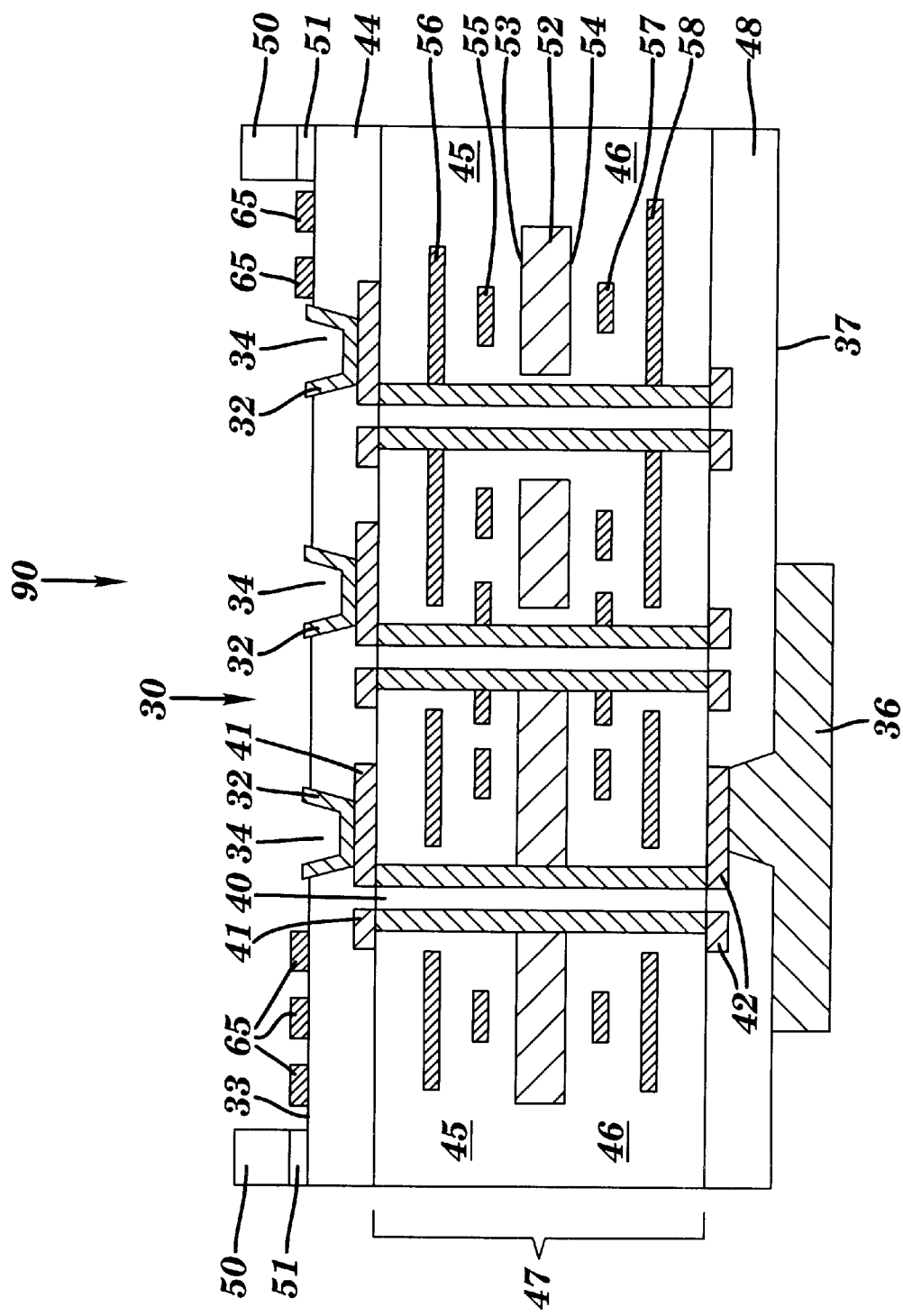
FIG. 9 depicts FIG. 3, showing a metal pattern coupled to, and above, the top surface of the substrate.
Figure 10:
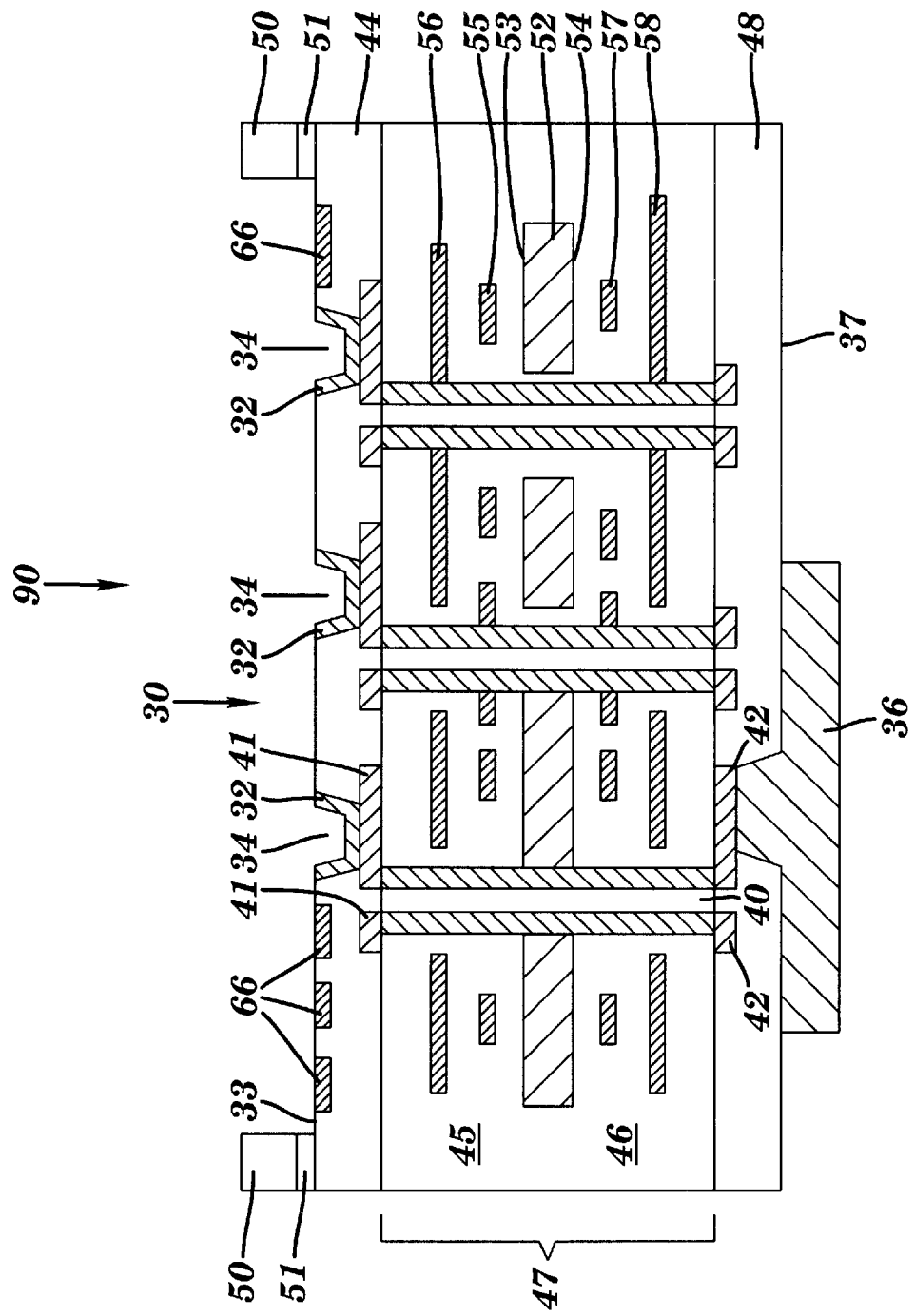
FIG. 10 depicts FIG. 3, showing a metal pattern coupled to, and below, the top surface of the substrate.

An insulatively metal pattern (e.g., any of the metal patterns 61, 62, 63, 64 in FIG. 5–8, respectively) that is coupled to the top surface 33 of the organic substrate 30 for thermal balancing purposes, may be formed either above or below the top surface 33 as shown in FIGS. 9 and 10, respectively.

FIG. 9 illustrates FIG. 3, showing a metal pattern 65 above, and coupled to, the top surface 33 of the organic substrate 30. The metal pattern 65 may be formed by any method known to one of ordinary skill in the art. If metal such as copper is utilized for the metal pattern 61, for example, then the metal pattern 65 may be formed by: bonding a preformed sheet of the metal (e.g., copper) on the top surface 33, reducing the thickness of the preformed sheet of the metal to the desired thickness, applying photoresist and photolithographically exposing portions of the metal sheet to radiation (e.g., ultraviolet radiation), chemically developing away unexposed photoresist, and stripping away the exposed photoresist, such that the metal pattern 65 has been generated and is insulatively isolated from any other conductive structure on or within the substrate 30. If both the metal structure 32 and the metal pattern 65 each include the same metal (e.g., copper), then the metal pattern 65 may be formed concurrent with, and by the same process as, formation of circuitization associated with the metal structure 32 on the top surface 33, which would enable the metal pattern 65 to be formed at little or no extra cost inasmuch as the circuitization associated with the metal structure 32 would be formed regardless of whether the metal pattern 65 is also formed.

If nickel is utilized for the metal pattern 61, then the metal pattern 65 may be formed by electroplating or sputter deposition. The thickness of the metal pattern 61 may be reduced as needed by any method known to one of ordinary skill in the art.

If aluminum is utilized for the metal pattern 61, then the metal pattern 65 may be formed by the same method described supra for copper, except that the thickness of the preformed sheet of aluminum cannot be easily reduced. Thus, the preformed sheet of aluminum should have a thickness that is close to desired thickness of the metal pattern 61.

FIG. 10 illustrates FIG. 3, showing a metal pattern 66 below, and coupled to, the top surface 33 of the organic substrate 30. The metal pattern 66 may be formed by any method known to one of ordinary skill in the art, such as by laser-drilling isolated cavities (i.e., blind vias) in the dielectric layer 44, and filling the cavities with the metal (of the intended metal pattern 66) by electroless plating on seeded surfaces (e.g., palladium seeded surfaces) of the cavities, followed by electroplating the metal to fill the cavities to the level of the top surface 33. It should be noted that the metal pattern 66 could be formed concurrent with, and by the same process as, formation of plated blind vias 34 described supra.

Figure 11:
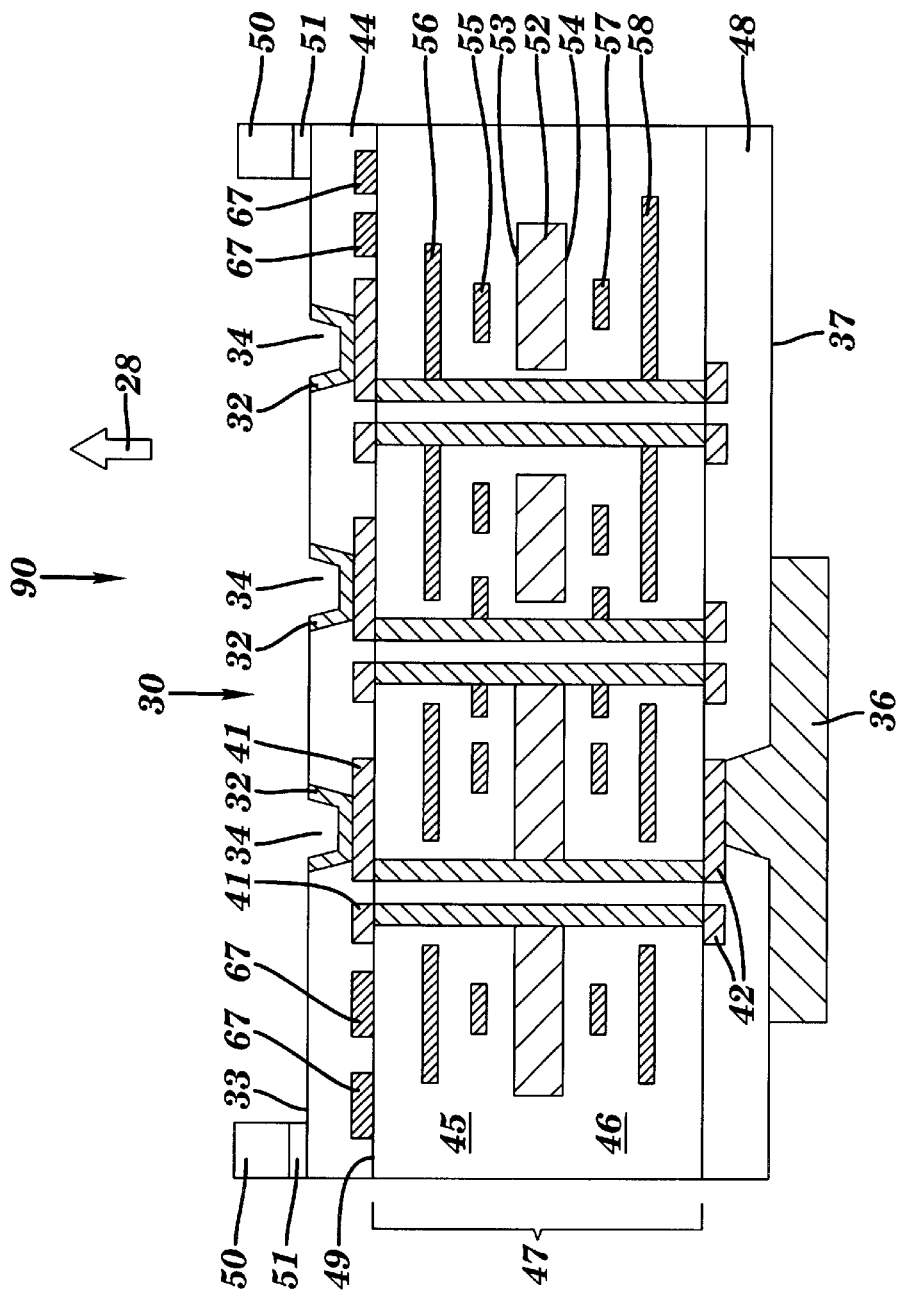
FIG. 11 depicts FIG. 3, showing a metal pattern within an interior portion of the substrate.

FIG. 11 illustrates FIG. 3, showing a metal pattern 67 coupled to a top surface 49 of the dielectric layer 45. The metal pattern 67 may be formed by any method known to one of ordinary skill in the art, such as by the same example method that was described for forming the metal pattern 65 in conjunction with FIG. 9. It should be noted that the metal pattern 67 could be formed concurrent with, and by the same process as, formation of the metal pad 41.

FIGS. 9–11 collectively illustrate that a metal pattern of the present invention (e.g., the metal pattern 65, 66, or 67 of FIG. 9, 10, or 11, respectively) should be positioned "adjacent to" the top surface 33 of the organic substrate 30, wherein "adjacent to" includes being coupled to (e.g., FIGS. 9–10) or being proximate to (e.g., FIG. 11). "Proximate to" means being located at a distance from the top surface 33 than does not exceed the thickness of the dielectric layer 44. As stated supra, the thickness of the dielectric layer 44 is preferably between about 40 microns and about 60 microns.

Figure 12:
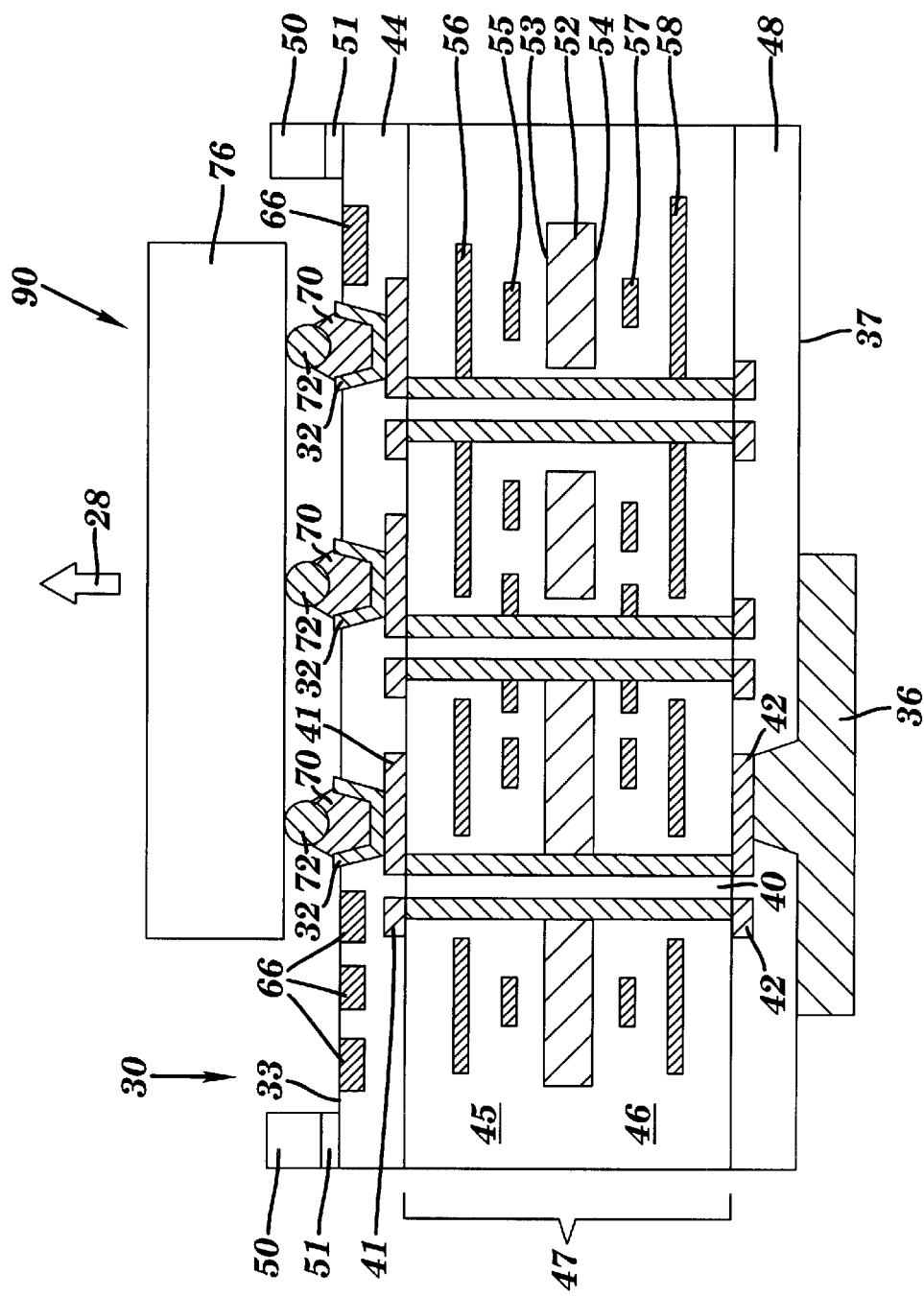
FIG. 12 depicts FIG. 10, after a semiconductor chip has been coupled to the substrate.

FIG. 12 illustrates FIG. 10 after a semiconductor chip 76 has been coupled to the organic substrate 30 by any solderably coupling process known to one of ordinary skill in the art. For example, the plated blind vias 34 (see FIG. 10) may be filled with a solder 70 shown in FIG. 12, and conductive contacts 72 of the semiconductor chip 76 are placed in contact with the solder 70. The solder 70 is thus conductively coupled to the metal structure 32. The solder 70 is then reflowed at a temperature above the melting temperature of the solder 70, and below the melting point of the conductive contacts 72, such that the reflowed solder 70 conductively abuts all conductive contacts 72, and adhesively and conductively couples with all conductive contacts 72 as the reflowed solder 70 cools. Thus at ambient room temperature, the semiconductor chip 76 is conductively coupled to the metal structure 32 at all conductive contacts 72 of the semiconductor chip 76.

In a preferred configuration, the conductive contacts 72 are Controlled Collapse Chip Connection (C4) solder balls comprising solder material having a composition of about 97% lead and about 3% tin with a melting temperature of about 310° C. In the preferred configuration, the solder 70 is a low-melt lead-tin solder with a melting temperature below about 230° C. and at least the melting point of 183° C. of the eutectic composition of about 63% lead and about 37% tin. The solder 70 may have any of various geometric shapes known to those of ordinary skill in the art, such as solder balls and solder columns.

Figure 1:
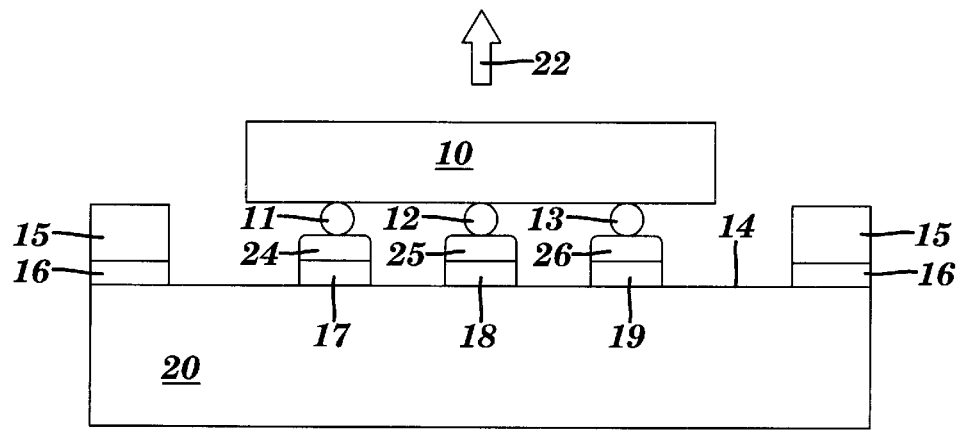
FIG. 1 depicts a front cross-sectional view of a semiconductor chip having solder balls resting on solder bumps of an organic chip carrier.
Figure 2:
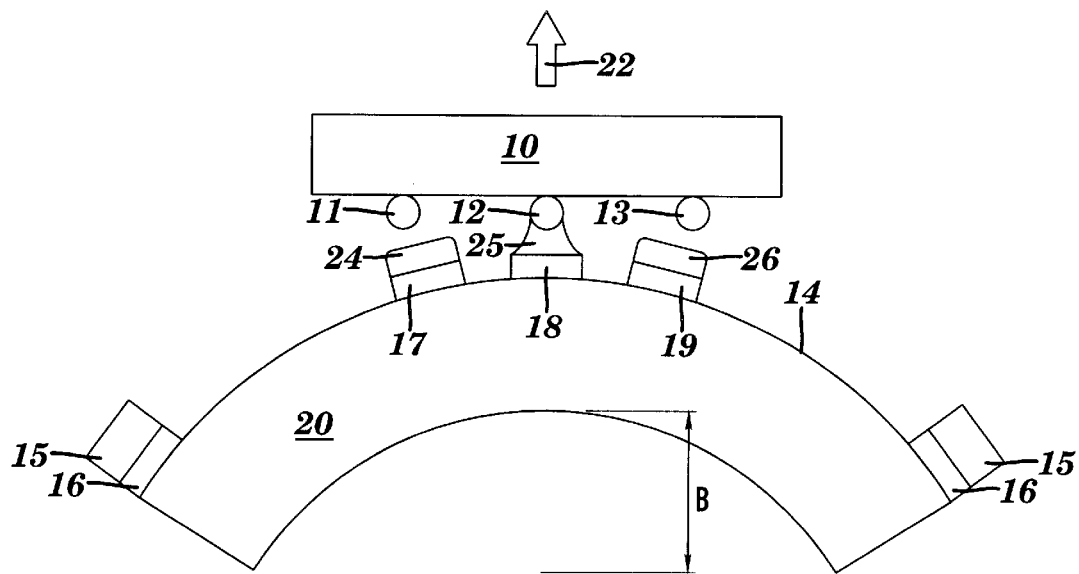
FIG. 2 depicts FIG. 1 after the substrate has been heated to reflow the solder bumps around the solder balls.

If the solder 70 were reflowed, and if the metal pattern 66 were absent, then a thermal expansion mismatch (i.e., $C_2A_2 > C_1A_1$) between the solder structure 36 on the bottom surface 37 and solder structure 32 on the top surface 33 would cause the top surface 33 to bow or bulge upward in the direction 28. The present invention reduces or eliminates the thermal mismatch by adding the metal pattern 66 to satisfy the condition that $(C_2A_2 - C_1A_1 - C_3A_3)$ is less than $(C_2A_2 - C_1A_1)$ in magnitude. $C_2A_2$ and $(C_3A_3 + C_1A_1)$ should differ in magnitude by no more than about 20%, and preferably by no more than about 10%. Within the aforementioned 20% magnitude differential between $(C_3A_3 + C_1A_1)$ and $C_2A_2$, and at a reflow temperature between about 183° C. and about 310° C., the present invention is capable of constraining bowing of the substrate 30 to within about 1 mil, and reducing the upward bowing by a factor of at least 2 in comparison with the bowing that would have occurred had the metal pattern 66 not been included (see FIG. 2 and accompanying discussion for a definition of the bowing B). Within the preferred 10% magnitude differential between $(C_3A_3 + C_1A_{11})$ and $C_2A_2$, and at a reflow temperature between about 183° C. and about 310° C., the present invention is capable of constraining bowing of the substrate 30 to within about ½ mil.

The semiconductor chip 76 in FIG. 12 is generally representative of an electronic device having a plurality of conductive contacts such as the conductive contacts 72. Any such electronic device that could be solderably coupled to the substrate 30 may substitute for the semiconductor chip 76 in FIG. 12.

The metal pattern 66 is electrically insulated from any other conductive structure on or within the substrate 30 and thus does not participate in any electrical conduction functionality of the substrate 30. While the metal pattern 66 is below and coupled to the top surface 33, the metal pattern 66 could be replaced by the metal pattern 65 depicted in FIG. 9 as above and coupled to the top surface 33. Similarly, the metal pattern 66 could be replaced by the metal pattern 67 depicted in FIG. 11. Thus, the semiconductor chip 76 could be coupled to the organic substrate 30 in the configurations of FIGS. 9 and 11 in the same manner as the semiconductor chip 76 could be coupled to the configuration of FIG. 10. Additionally, the metal pattern 66 could have any geometrical shape, such as the geometrical shape of any of the metal patterns 61–64 shown in FIGS. 5–8, respectively.

While preferred and particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

We claim:

1. An electronic structure, comprising:
    a substrate including an organic dielectric material and having an internal conductive structure within and through the substrate;
    a stiffener ring adhesively coupled to an outer portion of a first surface of the substrate;
    a first metal structure, coupled to the first surface of the substrate, and having a surface area $A_1$ and a coefficient of thermal expansion $C_1$;
    a second metal structure, coupled to a second surface of the substrate, and having a surface area $A_2$ and a coefficient of thermal expansion $C_2$, wherein $C_2A_2$ exceeds $C_1A_1$, and wherein the internal conductive structure conductively couples the first metal structure to the second metal structure; and
    a metal pattern, adjacent to the first surface of the substrate, and having a surface area $A_3$ and a coefficient of thermal expansion $C_3$, wherein $(C_2A_2 - C_1A_1 - C_3A_3)$ is less than $(C_2A_2 - C_1A_1)$ in magnitude, and wherein the metal pattern is electrically insulated from any other conductive structure on or within the substrate.

2. The electronic structure of claim 1, wherein the metal pattern is coupled to the first surface of the substrate and is above the first surface.

3. The electronic structure of claim 1, wherein the metal pattern is coupled to the first surface of the substrate and is below the first surface.

4. The electronic structure of claim 1, wherein $(C_3A_3 + C_1A_1)$ and $C_2A_2$ differ in magnitude by no more than about 20%.

5. The electronic structure of claim 4, wherein a temperature of the substrate is between about 183° C. and about 310° C., and wherein a bowing of the first surface of the substrate is less than a bowing that would have occurred, by a factor of at least about 2, had the metal pattern not been included in the electronic structure.

6. The electronic structure of claim 5, further comprising a semiconductor chip conductively coupled to the first metal structure.

7. The electronic structure of claim 4, further comprising a semiconductor chip conductively coupled to the first metal structure at all conductive contacts of the semiconductor chip.

8. The electronic structure of claim 1, where in the internal conductive structure includes a plated through hole (PTH), and wherein the substrate further includes:
    a thermally conductive layer having first and the second opposing surfaces;
    a first and a second dielectric layer positioned on the first and the second opposing surfaces, respectively, of the thermally conductive layer, wherein the first and second dielectric layers each include the organic dielectric material;
    a first power plane within the first dielectric layer;
    a first signal plane within the first dielectric layer and positioned between the thermally conductive layer and the first power plane;
    a second power plane within the second dielectric layer;
    a second signal plane within the second dielectric layer and positioned between the thermally conductive layer and the second power plane;
    a third dielectric layer positioned on the first dielectric layer at a surface of the first dielectric layer, wherein the third dielectric layer includes a dielectric material characterized by a coefficient of thermal expansion that increases by no more than a factor of about 3 as a temperature of the third dielectric layer increases from just below to just above a glass transition temperature of the third dielectric layer, and wherein the first surface of the substrate includes a surface of the third dielectric layer; and a fourth dielectric layer positioned on the second dielectric layer, wherein the fourth dielectric layer includes the dielectric material, and wherein the second surface of the substrate includes a surface of the fourth dielectric layer.

9. The electronic structure of claim 8, wherein the metal pattern is coupled to the surface of the first dielectric layer.

10. The electronic structure of claim 8, wherein the dielectric material includes an allylated polyphenylene ether.

11. The electronic structure of claim 8, wherein the first metal structure includes a conductive metal, the second metal structure includes the conductive metal, and the metal pattern includes the conductive metal.

12. The electronic structure of claim 11, wherein the conductive metal includes copper.

13. The electronic structure of claim 8, wherein ($C_3A_3$+ $C_1A_1$) and $C_2A_2$ differ in magnitude by no more than about 20%.

14. The electronic structure of claim 13, wherein a temperature of the substrate is exceeds about 183° C. and is less than about 310° C., and wherein a bowing of the first surface of the substrate does not exceed about one mil.

15. The electronic structure of claim 14, further comprising a semiconductor chip conductively coupled to the first metal structure.

16. The electronic structure of claim 13, further comprising an electronic device conductively coupled to the first metal structure at all conductive contacts of the semiconductor chip, and wherein the semiconductor chip and the first metal structure are at ambient room temperature.

17. The electronic structure of claim 16, wherein the electronic device includes a semiconductor chip.

* * * * *